United States Patent
Clara et al.

(10) Patent No.: US 6,593,868 B2
(45) Date of Patent: Jul. 15, 2003

(54) DIFFERENTIAL DIGITAL/ANALOG CONVERTER

(75) Inventors: Martin Clara, Villach (AT); Andreas Wiesbauer, Pörtschach (AT); Berthold Seger, Villach (AT)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/923,237

(22) Filed: Aug. 3, 2001

(65) Prior Publication Data

US 2002/0063644 A1 May 30, 2002

(30) Foreign Application Priority Data

Aug. 7, 2000 (DE) .......................................... 100 38 372

(51) Int. Cl.[7] .............................................. H03M 1/66
(52) U.S. Cl. ...................................... 341/144; 341/145
(58) Field of Search .................................. 341/144, 145

(56) References Cited

U.S. PATENT DOCUMENTS

| | | | | |
|---|---|---|---|---|
| 5,815,103 A | * | 9/1998 | Comminges et al. ....... | 341/144 |
| 6,346,901 B1 | * | 2/2002 | Aiura et al. ................ | 341/153 |
| 6,362,764 B1 | * | 3/2002 | Niimi et al. ................. | 341/144 |

FOREIGN PATENT DOCUMENTS

| | | |
|---|---|---|
| EP | 0539828 A2 | 5/1993 |
| JP | 00040965 A | 2/2000 |
| WO | WO 98/20616 | 5/1998 |

* cited by examiner

*Primary Examiner*—Peguy JeanPierre
*Assistant Examiner*—Joseph Lauture
(74) *Attorney, Agent, or Firm*—Jenkins & Wilson, P.A.

(57) ABSTRACT

A differential digital/analog converter for the conversion of a digital input value into an analog output voltage with a first current source group, which has a plurality of current sources comprising at least one p-MOS transistor, which can be switched to at least one current collecting line (11, 12) in dependence on the digital input value, the first current source group having a binary current source switching segment (4) comprising binary current sources (6), with a second current source group, which has a plurality of current sources comprising at least one n-MOS transistor, which can be switched to the current collecting line (11, 12) in dependence on the digital input value, the second current source group having a binary current source switching segment (5) comprising binary current sources (13), and with an output buffer (3) for the conversion of the current flowing on the at least one current collecting line (11, 12) into the analog output voltage.

7 Claims, 3 Drawing Sheets

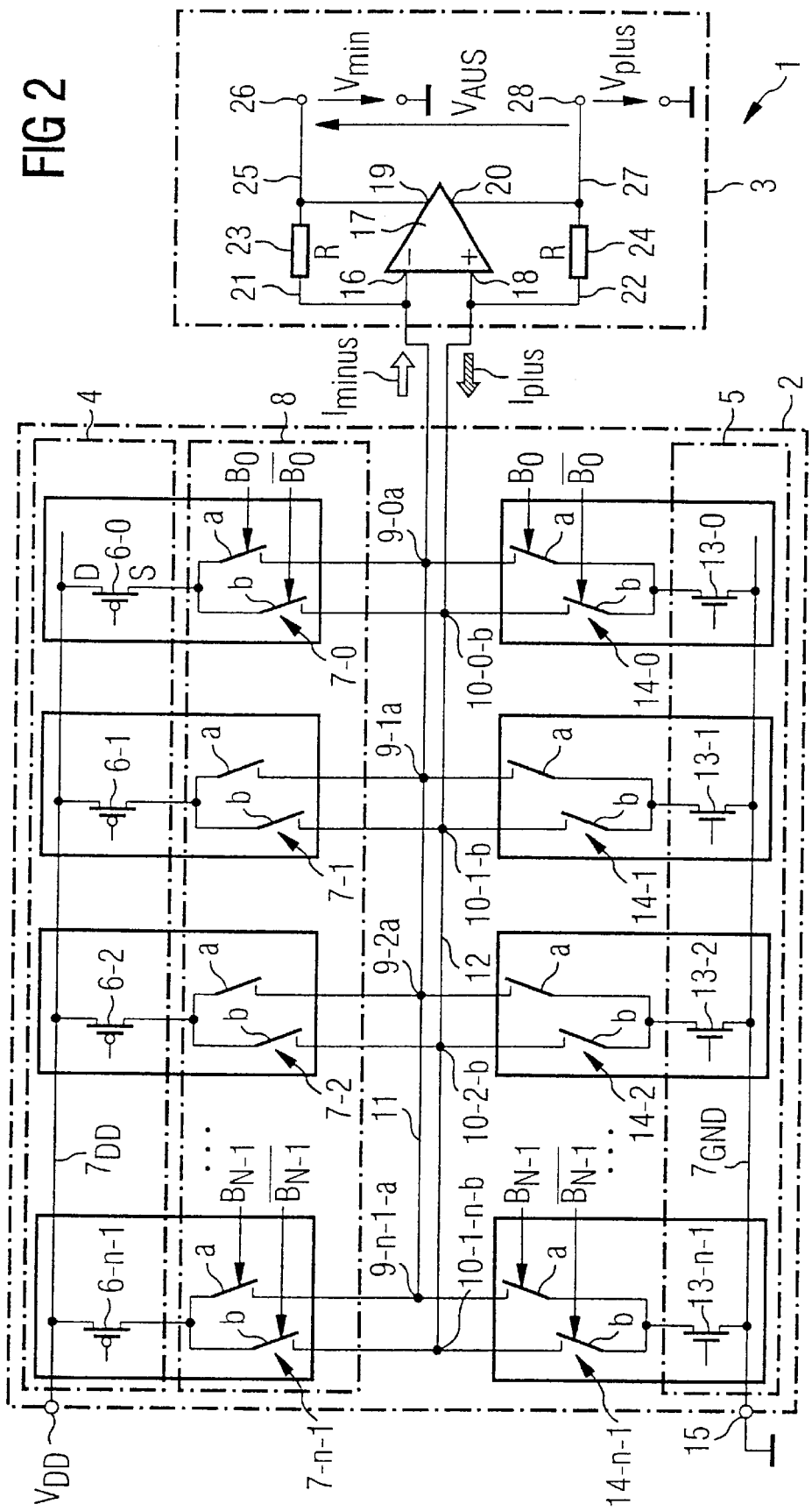

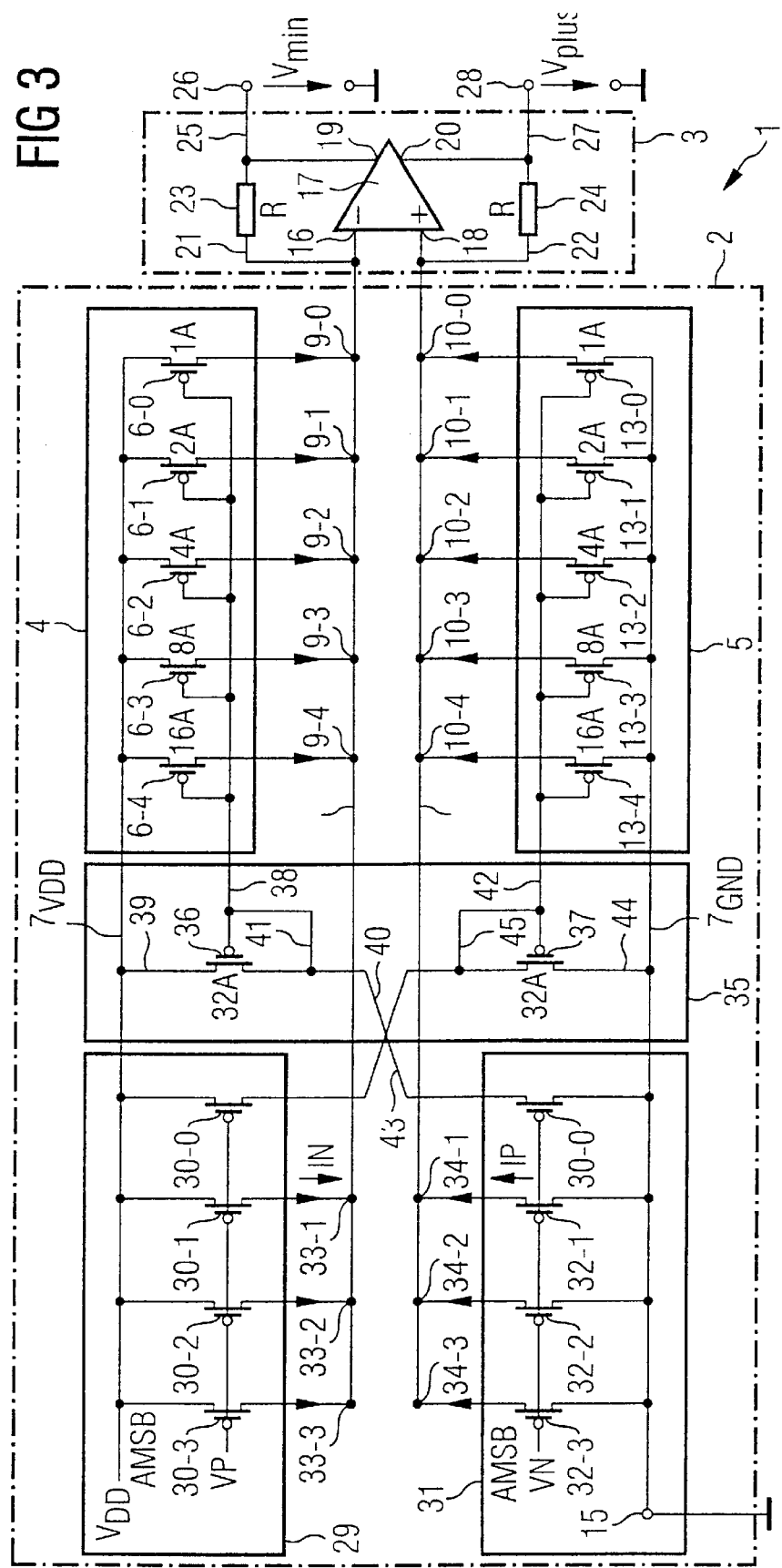

டிFFERENTIAL DIGITAL/ANALOG CONVERTER

TECHNICAL FIELD

The invention relates to a differential digital/analog converter and in particular to a segmented differential digital/analog converter with an integrated current matching circuit for matching the currents delivered by the segments.

RELATED ART

Digital/analog converters are electronic circuits which convert a digital signal, i.e. a binary coded digital word, into an analog signal. The conversion takes place at discrete points in time, so that the analog signal is available at specific time intervals.

FIG. 1 shows a digital/analog converter according to the prior art. The binary-weighted current sources $I_0$, $I_1$, $I_2$, ... used by the digital/analog converter DAC are binary-weighted current sources which deliver current values I, 2I, 4I .... The current sources can be switched via switching devices to a current collecting line SL, which is connected to the inverting input of an operational amplifier OP. The non-inverting input of the operational amplifier OP is connected via a line to ground.

The switching devices are formed by the diodes represented in FIG. 1. If, for example, the data bit $b_0$ has the data value 0, the diode $D_{0b}$ connected to the current source $I_0$ is turned on and the current source $I_0$ is bridged. If, conversely, the data bit $b_0$ is equal to 1, the diode $D_{0b}$ and the current source $I_0$ will provide a contribution to the current on the current collecting line SL. The output of the operational amplifier OP is fed back to the inverting input via a feedback resistor $R_N$. The analog output voltage $U_{DAC}$ present at the output of the digital/analog converter DAC is proportional to the sum of the currents switched through to the current collecting line SL and is consequently proportional to the applied digital value. The following holds true:

$$I_i = 2^{i-1} \cdot I_{LSB}$$

However, the conventional digital/analog converter represented in FIG. 1 has the disadvantage that it is not of a differential construction, but merely supplies an analog output voltage $U_{DAC}$ to ground.

In the case of an integration of the conventional DAC shown in FIG. 1, the analog output signal delivered by the DAC is susceptible to interference signals, which originate from a common substrate on which the DAC and further circuits are located.

A further disadvantage of the conventional prior-art DAC represented in FIG. 1 is that a circuit arrangement with further circuits for signal processing of the analog signal delivered is possible only with additional circuitry, since a common mode recovery is necessary.

SUMMARY OF THE INVENTION

It is therefore an object of the present invention to provide a digital/analog converter which is insensitive to interference signals from further circuits.

This object is achieved according to the invention by a digital/analog converter of a fully differential construction with the features specified in patent claim 1.

One advantage of the digital/analog converter according to the invention is that it can be connected without additional circuitry to other circuits, which carry out subsequent analog processing of the analog output signal.

The invention provides a differential digital/analog converter for the conversion of a digital input value into an analog output voltage with a first current source group, which has a plurality of current sources comprising at least one p-MOS transistor, which can be switched to at least one current collecting line in dependence on the applied digital input value, a second current source group, which has a plurality of current sources comprising at least one n-MOS transistor, which can be switched to the current collecting line in dependence on the applied digital input value, and with an output buffer for the conversion of the current flowing on the current collecting line into the analog output voltage.

In the case of a preferred embodiment of the differential digital/analog converter according to the invention, the first and second current source groups in each case have a thermometer current source switching segment, comprising thermometer current sources, and a binary current source switching segment, comprising binary current sources.

In the case of a further preferred embodiment of the differential digital/analog converter according to the invention, the digital/analog converter has a current matching circuit, which is provided for matching that current which is delivered by the binary current source switching element of the first current source group to that current which is delivered by the thermometer current source switching segment of the second current source group and which is provided for matching that current which is delivered by the binary current source switching segment of the second current source group to that current which is delivered by the thermometer current source switching segment of the first current source group.

This offers the particular advantage that linearity errors caused by the segmentation are avoided.

The digital input value to be converted, present at an input, preferably comprises k data bits, the n least significant data bits of the digital input value switching the two binary current source segments respectively comprising n binary current sources to the current collecting line, the m most significant data bits being applied to a decoder for switching $2^m-1$ thermometer current sources, which are in each case provided within the two thermometer current source switching segments, to the current collecting line.

The binary current source switching segments preferably comprise in each case n binary current sources, the current $I_i$ delivered by the ith current source ($1 \leq I \leq n$) amounting to $$I_i = 2^{i-1} \cdot I_{LSB},$$

where $I_{LSB}$ is the current which is delivered by that current source which is assigned to the least significant data bit of the digital input value.

The output buffer preferably has a fed-back operational amplifier.

In this case, the operational amplifier is preferably fed back via at least one resistor.

In the case of a particularly preferred embodiment of the differential digital/analog converter according to the invention, the current matching circuit is a current mirror circuit, which contains at least one current mirror transistor for matching the current which is delivered by the binary current source segments to that current which is delivered by the thermometer current source segments.

The mirror current generated by the current mirror transistor preferably corresponds to the sum of the current delivered by the binary current source switching segment and the current of the binary current source for the least significant data bit.

BRIEF DESCRIPTION OF THE DRAWINGS

Preferred embodiments of the differential digital/analog converter according to the invention are described below to explain features essential for the invention.

In the drawing:

FIG. 2 shows a digital/analog converter of a fully differential construction according to the invention;

FIG. 3 shows a particularly preferred embodiment of the digital/analog converter of a fully differential construction according to the invention, with a current matching circuit.

DETAILED DESCRIPTION OF THE INVENTION

Figure 1:
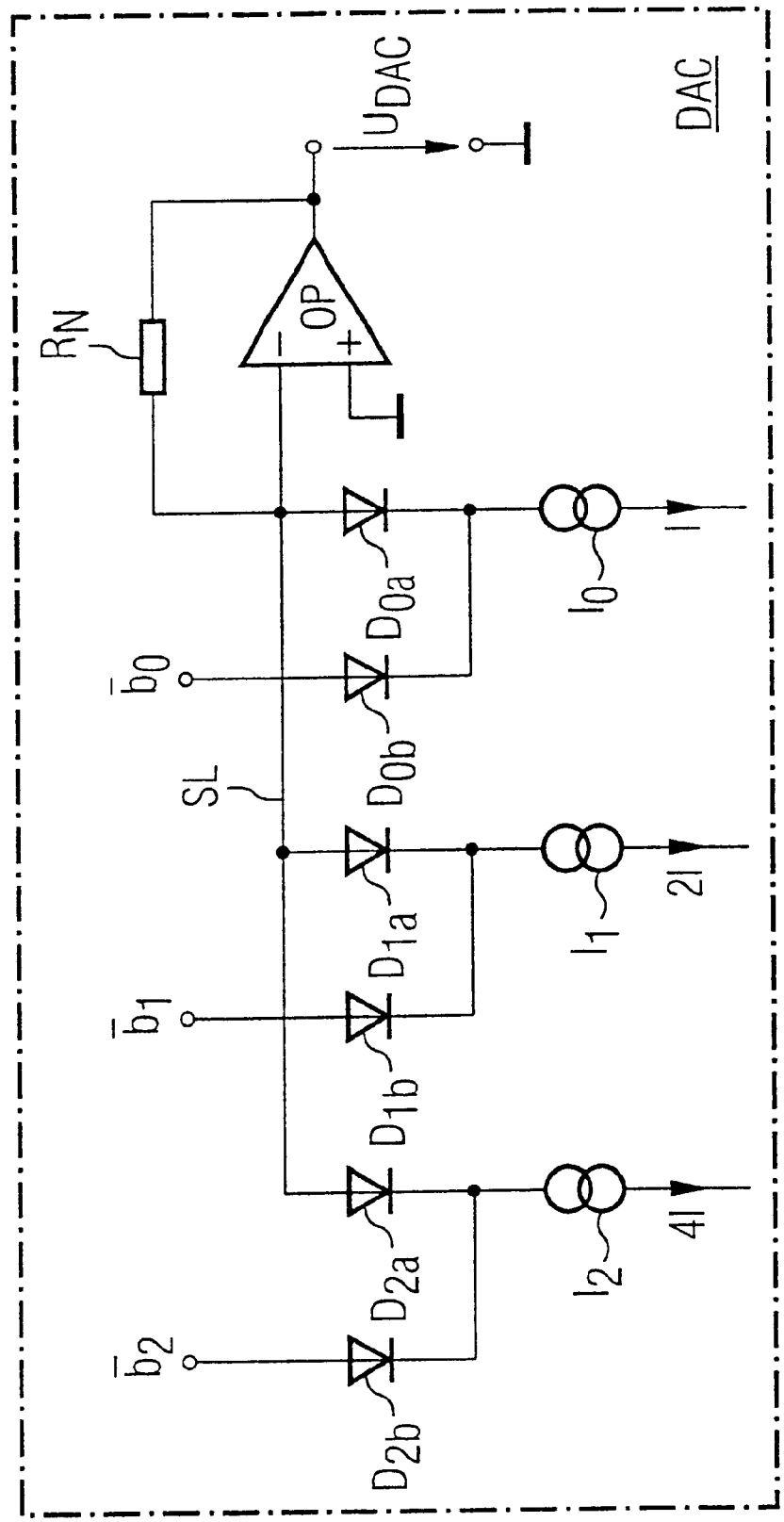
FIG. 1 shows a digital/analog converter according to the prior art.

The digital/analog converter 1 according to the invention, represented in FIG. 2, contains a current source zone 2 and a downstream output buffer 3, connected to the current source zone 2. For reasons of overall clarity, the current source zone 2 and the output buffer are represented in a slightly perspective view in the representation chosen in FIG. 2.

The current source zone 2 has a first current source group and a second current source group, of a construction complementary to said first group. The first current source group contains a multiplicity of binary-weighted binary current sources 6-0, 6-1, 6-2, 6-n-1. The binary current sources of the first current source group are formed by p-MOS transistors, the drain terminals of which are respectively connected to a common current supply line $7_{DD}$ for a supply voltage $V_{DD}$. The currents delivered by the binary current sources 6-0 to 6-n-1 are binary-weighted in relation to one another, the current source 6-0 being assigned to the least significant bit LSB and delivering a current $I_{LSB}$. The next parallel-connected current source 6-1 delivers a constant current, which is twice as high as the current delivered by the first current source 6-0, i.e. $2 \cdot I_{LSB}$. The next parallel-connected current source 6-2 for its part delivers a current which is twice as high as the source current generated by the current source 6-1. The current sources of the first current source group are in each case connected to the double switching devices 7-0, 7-1, 7-2, . . . 7-n-1 of a switching device 8. The switches 7-0 to 7-n-1 are in this case preferably formed by semiconductor components. Each double switching device 7-0 to 7-n-1 has two switching elements a, b connected in parallel with respect to each other, the switching elements 7-0a to 7-n-1a in each case being controlled by a data bit $b_0$ to $b_{n-1}$ of the digital input value to be converted, and the switching elements 7-0b to 7-n-1b being controlled by the respectively inverted data bit $\overline{b}_0$ to $\overline{b}_{n-1}$. Consequently, the source terminals of the current sources 6-0 to 6-n-1 for the delivery of the associated binary-weighted drain current to terminal nodes 9-0a to 9-n-1a or 10-b to 10-n-1b are switched to a first current collecting line 11 for the delivery of a negative summated current $I_{minus}$ or to a second current collecting line 12 for the generation of the positive summated current $I_{plus}$ in dependence on the applied digital input value.

The second current source group, constructed to complement the first current source group, comprises a plurality of current sources 13-0 to 13-n-1, which in each case contain at least one n-MOS transistor. In this case, the source terminals of the n-MOS transistors 13-0 to 13-n-1 are connected to a common grounding line $7_{GNP}$, which is connected to a ground terminal 15 of the DAC 1 according to the invention. The drain terminals of the n-MOS transistors 13-0 to 13-n-1 are in each case connected to double switching devices 14-0 to 14-n-1, which in each case comprise two switching elements a, b. The switching elements 14-0a to 14-n-1-a and also 14-0b to 14-n-1-b are preferably formed in each case by semiconductor components. In this case, the switching components 14-0a to 14-n-1a are respectively driven by the inverted data bits $\overline{b}_0$ to $\overline{b}_{n-1}$, whereas the switching components 14-0b to 14-n-1b connected in parallel thereto are respectively driven by the non-inverted data bits $b_0$ to $b_{n-1}$ of the applied digital value to be converted. The switching components 14-0a to 14-n-1a switch the source terminals of the n-MOS current sources 13-0 to 13-n-1 respectively to the current terminal nodes 9-0a to 9-n-1a of the negative current collecting line 11. The switching components 14-0b to 14-n-1b respectively switch the n-MOS current sources 13-0 to 13-n-1 of the second current source group to the current nodes 10-0b to 10-n-1b of the negative current collecting line 12.

The first current collecting line 11 for generating a negative summated current $I_{minus}$ lies at an inverting terminal 16 of an operational amplifier 17, the non-inverting input 18 of which is connected to the second current collecting line 12. The output terminals 19, 20 of the fully differential operational amplifier 17 are in each case fed back via feedback lines to the inputs of the operational amplifier 17. In this case, the first operational amplifier output 19 is fed back via a feedback line 21 to the inverting input 16 and the second output terminal 20 of the operational amplifier 17 is connected via a feedback line 22 to the non-inverting input 18 of the operational amplifier 17. A first resistor 23 is connected into the first feedback line 21, whereas a second resistor 24 is connected into the second feedback line 22. The feedback line 21 is connected via a line 25 to a first differential output terminal 26 of the DAC 1 according to the invention and the second feedback line 22 is connected via an output line 27 to a second differential output terminal 28 of the DAC 1 of a fully differential construction according to the invention. At the first fully differential output terminal 26 there is a first negative analog output voltage $V_{minus}$ with respect to ground, whereas at the second fully differential output terminal 28 there is a positive analog output voltage $V_{plus}$ with respect to ground. Between the two differential output terminals 26, 28 of the DAC according to the invention there is an analog differential output voltage $V_{aus}$.

The output buffer 3 serves for the conversion of the summated currents flowing on the current collecting lines 11, 12 into the analog output voltages. The transimpedance output buffer 3 contains a two-stage operational amplifier 17 which is of a fully differential construction and is fed back via the resistors 23, 24.

FIG. 3 shows a particularly preferred embodiment of the DAC 1 of a fully differential construction according to the invention.

In the case of the particularly preferred embodiment shown in FIG. 3 of the digital/analog converter 1 of a fully differential construction according to the invention, the current source zone 2 is of a segmented construction, the first current source group having in addition to the binary current source switching segment 4 comprising binary current sources 6-0 to 6-4 a thermometer current source switching segment 29. The thermometer current source switching segment 29 of the first current source group has a plurality of thermometer current sources 30-0 to 30-3. The thermometer current sources 30-0 to 30-3 are in each case formed by p-MOS transistors, the gate terminals of which are connected to a common voltage potential $V_P$. The drain terminals of the thermometer current sources 30-0 to 30-3 are connected to the supply voltage line $7_{DD}$ for applying a supply voltage $V_{DD}$.

The second current source group has in addition to the binary current source switching segment 5, made up of binary current sources, likewise a thermometer current source switching segment 31. The thermometer current source switching segment 31 comprises a plurality of thermometer current sources 32-0 to 32-3, the gate terminals of which are connected to a common voltage potential $V_N$.

The source terminals of the thermometer current sources 30-0 of the first thermometer current source switching segment 29 of the first current source group are connected at current nodes 33-1 to 33-3 to the first current collecting line 11. The drain terminals of the thermometer current sources 33-1 to 32-3 of the second thermometer current source switching segment 31 are connected at current nodes 34-1 to 34-3 to the second current collecting line 12.

The segmentation of the current source zone 2 into thermometer current source switching segments 29, 31 and into binary current source segments 4, 5 offers a good compromise in terms of switching technology between a DAC whose current source zone 2 merely comprises binary current sources and a DAC whose current source zone 2 merely comprises thermometer-coded current sources. A current source zone 2 composed only of binary current sources offers the advantage that the decoding of the applied digital input value can be performed in a particularly simple way. On the other hand, a current source zone 2 composed only of thermometer current sources offers a particularly high dynamic capability of the DAC. The thermometer current sources are driven by a decoder, which requires a certain chip area in the case of integration.

In the case of each of the two binary current source segments 4, 5, the segmented embodiment of the DAC 1 according to the invention, represented in FIG. 3, respectively has N binary-weighted current sources, the source current delivered by the current sources being directly proportional to the respective gate area of the MOS transistor. The MOSFET 6-0 or 14-0 belonging to the least significant bit LSB has a gate area A. The gate area of the next MOSFET respectively within the binary current source segment is in each case twice as high as the gate area of the preceding MOSFET.

The gate area of the thermometer current source MOSFETs 30-0 to 30-3 or 32-0 to 32-3 is of the same size (AMSB). For the m thermometer-coded data bits, $2^{m-1}$ current sources, which supply the same current value $2^n \cdot I_{LSB}$, are provided in the thermometer current source switching segment 29 and 31, respectively.

An ideal digital/analog converter has for each code transition the same step height $1 \cdot I_{LSB}$ with a total of $2^{n+m}-1$ converter stages. The critical code transition is at the transition from the value $2^{n-1}$ to the value $2^n$. At this code transition, all the binary current sources are switched off and the next thermometer current source within the thermometer current source switching segment is switched on. The greatest linearity error, i.e. the greatest deviation from the ideal step height $1 \cdot I_{LSB}$, is obtained if the thermometer current source does not deliver a source current with the current value $2^n \cdot I_{LSB}$ specified above. This code transition is therefore the critical code transition, because at this code transition the most binary current sources are switched off and consequently the greatest deviation can occur.

To avoid linearity errors within the digital/analog converter 1, it must therefore be ensured that the sum of the source currents delivered by the binary current sources plus a current value of $1 \cdot I_{LSB}$ is equal to the current in the thermometer current source. In this case, the step height at the critical code transition is precisely $1 \cdot I_{LSB}$ and no linear error occurs.

In the case of the digital/analog converter 1 of a fully differential construction according to the invention, the fully differential output voltage at the output of the transimpedance amplifier 3 results from the resistance value and the sum of the currents on the current collecting lines 11, 12. Therefore, in the case of the digital/analog converter 1 according to the invention, the segments of the first current source group can be adjusted with corresponding segments of the second current source group, and vice versa.

With the segmentation into binary current sources and thermometer current sources, in the case of the preferred embodiment shown in FIG. 3 a current matching circuit 35 is used to adapt that current which is delivered by the binary current source switching segment 4 of the first current source group to that current which is delivered by the thermometer current source switching segment 31 of the second current source group. Furthermore, the current matching circuit 35 carries out a matching of that current which is delivered by the binary current source switching segment 5 of the second current source group to that current which is delivered by the thermometer current source switching segment 29 of the first current source group. Therefore, no linearity error is obtained in the fully differential output voltage.

In the case of a code D with D=0 . . . $2^{n+m}-1-L$, the following is obtained for the currents IN and IP delivered by the thermometer current sources:

$IP = IN + \Delta IN.$

The current delivered by the p-MOS current sources 30 differs from the current IP delivered by the n-MOS transistors by $\Delta IN$.

The following holds true for the current $I_{minus}$ flowing on the current collecting line 11:

$I_{minus} = (L-D) \cdot IP - D \cdot (IN + \Delta IN).$

The following holds true for the current $I_{plus}$, flowing on the second current collecting line 12:

$I_{plus} = D \cdot IP + (L-D) \cdot (IN + \Delta IN).$

Therefore, for the sum of the two summated currents $I_{sum} = I_{plus} + I_{minus},$ the following holds true:

$$I_{sum} = 2 \cdot (L - 2 \cdot D) \cdot (IP + IN) =$$
$$2 \cdot (L - 2 \cdot D) \cdot 2 \cdot IN + 2 \cdot (L - 2 \cdot D) \cdot \Delta IN =$$
$$2 \cdot (L - 2 \cdot D) \cdot (IN + \Delta IN).$$

Consequently, no linearity error occurs. The current matching circuit 35 preferably comprises a current mirror circuit. In the case of the particularly preferred embodiment shown in FIG. 3, this current mirror circuit has a first p-MOS current mirror transistor 36 and a second current mirror transistor 37. The gate area of the current mirror transistors is precisely twice as large as the gate area of the binary current source provided for the most significant data bit. The gate of the first current mirror transistor 36 is connected via a line 38 to the gate terminals of the binary current sources 6-0 to 6-4 of the binary current source segment 4. The drain terminal of the current mirror transistor 36 is connected via a line 39 to the supply voltage line $7_{DD}$. The drain terminal of the first current mirror transistor 36 is connected via a cross-coupling line 40 to the drain terminal of the thermometer code transistor 32-0 of the thermometer code current source switching segment 31 of the second current source group. The gate terminal of the current mirror transistor 36 is connected via a line 41 to the cross-coupling line 40.

The second current mirror transistor 37 is an n-MOS transistor, the gate terminal of which is connected via a line 42 to the gate terminals of the binary current source MOS-FETs 14-0 to 14-4 of the binary current source switching segment 5 of the second current group. The drain terminal of the current mirror transistor 37 is connected via a cross-coupling line 43 to the source terminal of the thermometer code current source MOSFET 30-0 of the thermometer current source switching segment 29. The source terminal of the second current mirror transistor 37 is connected via a line 44 to the grounding line $7_{GND}$ of the current source zone 2. The gate of the second current mirror transistor 37 is connected via a connecting line 45 to the second cross-coupling line 43.

The current matching circuit 35 has the effect of avoiding mismatching between the binary current sources and the thermometer current sources and consequently a linearity error of the DAC 1 according to the invention. The current matching circuit 35 matches the sum of the binary-weighted currents plus the current of the least significant current source to the current which is delivered by a thermometer code current source.

The analog output signal delivered by the differential digital/analog converter according to the invention is fully differential and consequently susceptible to interference signals. The differential digital/analog converter 1 according to the invention is consequently particularly suitable for the integration of further circuits on a common substrate. The differential digital/analog converter is in this case preferably produced by using CMOS technology.

What is claimed is:

1. A differential digital/analog converter for the conversion of a digital input value into an analog output voltage, the converter comprising:
   (a) a first current source group including a plurality of current sources comprising:
      (i) at least one p-MOS transistor, which can be switched to a first current collecting line in dependence on the digital input value, and
      (ii) a binary current source switching segment including n binary current sources, wherein the current $I_i$ delivered by the $I^{th}$ current source (1 in) amounting to $I_i=2^{i-1}*I_{LSB}$, wherein I is the current which is delivered by that current source which is assigned to the least significant data bit LSB of the digital input value;
   (b) a second current source group including a plurality of current sources comprising:
      (i) at least one n-MOS transistor, which can be switched to a second current collecting line in dependence on the digital input value, and
      (ii) a binary current source switching segment including n binary current sources, the current $I_i$ delivered by the $I^{th}$ current source (1 in) amounting to $I_i=2^{i-1}*I_{LSB}$, wherein I is the current which is delivered by that current source which is assigned to the least significant data bit LSB of the digital input value; and
   (c) an output buffer for the conversion of the current flowing on the first and second current collecting line into the analog output voltage.

2. A differential digital/analog converter for the conversion of a digital input value into an analog output voltage, the converter comprising:
   (a) a first current source group including a plurality of current sources comprising:
      (i) at least one p-MOS transistor, which can be switched to a first current collecting line in dependence on the digital input value,
      (ii) a thermometer current source switching segment including thermometer current sources, and
      (iii) a binary current source switching segment including binary current sources;
   (b) a second current source group including a plurality of current sources comprising:
      (i) at least one n-MOS transistor, which can be switched to a second current collecting line in dependence on the digital input value, and
      (ii) a thermometer current source switching segment including thermometer current sources, and
      (iii) a binary current source switching segment including binary current sources;
   (c) a current mirror circuit including at least one current mirror transistor for matching the current delivered by the binary current source switching element of the first current source group to the current delivered by the thermometer current source switching segment of the second current source group, and for matching the current delivered by the binary current source switching segment of the second current source group to the current delivered by the thermometer current source switching segment of the first current source group; and
   (d) an output buffer for the conversion of the current flowing on the first and second current collecting line into the analog output voltage.

3. A differential digital/analog converter for the conversion of a digital input value into an analog output voltage, the converter comprising:
   (a) a first current source group including a plurality of current sources comprising:
      (i) at least one p-MOS transistor, which can be switched to a first current collecting line in dependence on the digital input value,
      (ii) a thermometer current source switching segment including a thermometer current sources, and
      (iii) a binary current source switching segment including binary current sources;
   (b) a second current source group including a plurality of current sources comprising:
      (i) at least one n-MOS transistor, which can be switched to a second current collecting line in dependence on the digital input value,
      (ii) a thermometer current source switching segment including a thermometer current sources, and
      (iii) a binary current source switching segment including binary current sources;
   (c) a current mirror circuit including at least one current mirror transistor for matching the current delivered by the binary current source switching element of the first current source group to the current delivered by the thermometer current source switching segment of the second current source group, and for matching the current delivered by the binary current source switching segment of the second current source group to the current delivered by the thermometer current source switching segment of the first current source group, wherein the mirror current generated by the current mirror transistor corresponds to the sum of all the source currents delivered by the binary current sources of the binary current source switching segment and the source current of the binary current source for the least significant bit LSB of the digital input value, and (d) an output buffer for the conversion of the current flowing on the first and second current collecting line into the analog output voltage.

4. A differential digital/analog converter for the conversion of a digital input value into an analog output voltage with:
(a) a first current source group including a plurality of current sources comprising:
(i) at least one p-MOS transistor, which can be switched to a first current collecting line in dependence on the digital input value, and
(ii) a binary current source switching segment including n binary current sources, the current $I_i$ delivered by the $i^{th}$ current source ($1 \leq i \leq n$) amounting to $I_i = 2^{i-1} * I_{LSB}$, wherein $I_{LSB}$ is the current which is delivered by that current source which is assigned to the least significant data bit LSB of the digital input value;
(b) a second current source group including a plurality of current sources comprising:
(i) at least one n-MOS transistor, which can be switched to a second current collecting line in dependence on the digital input value, and
(ii) a binary current source switching segment including n binary current sources, the current $I_i$ delivered by the $i^{th}$ current source ($1 \leq i \leq n$) amounting to $I_i = 2^{i-1} * I_{LSB}$, wherein $I_{LSB}$ is the current which is delivered by that current source which is assigned to the least significant data bit LSB of the digital input value; and
(c) an output buffer including a differential operational amplifier including inputs in electrical communication with the first and second current collecting lines and an output having an analog output voltage of the current flow differential on the first and second current collecting lines.

5. A differential digital/analog converter for the conversion of a digital input value into an analog output voltage with:
(a) a first current source group, which has a plurality of current sources comprising at least one p-MOS transistor, which can be switched to a first current collecting line in dependence on the digital input value;
(b) a second current source group, which has a plurality of current sources comprising at least one n-MOS transistor, which can be switched to a second current collecting line in dependence on the digital input value; and
(c) an output buffer including a fed-back operational amplifier including inputs in electrical communication with the first and second current collecting lines and an output having an analog output voltage of the current flow differential on the first and second current collecting lines.

6. A differential digital/analog converter for the conversion of a digital input value into an analog output voltage with:
(a) a first current source group including a plurality of current sources comprising:
(i) at least one p-MOS transistor, which can be switched to a first current collecting line in dependence on the digital input value,
(ii) a thermometer current source switching segment including thermometer current sources, and
(iii) a binary current source switching segment including binary current sources;
(b) a second current source group including a plurality of current sources comprising:
(i) at least one n-MOS transistor, which can be switched to a second current collecting line in dependence on the digital input value, and
(ii) a thermometer current source switching segment including thermometer current sources, and
(iii) a binary current source switching segment including binary current sources;
(c) a current mirror circuit including at least one current mirror transistor for matching the current delivered by the binary current source switching element of the first current source group to the current delivered by the thermometer current source switching segment of the second current source group, and for matching the current delivered by the binary current source switching segment of the second current source group to the current delivered by the thermometer current source switching segment of the first current source group; and
(d) an output buffer including a differential operational amplifier including inputs in electrical communication with the first and second current collecting lines and an output having an analog output voltage of the current flow differential on the first and second current collecting lines.

7. A differential digital/analog converter for the conversion of a digital input value into an analog output voltage with:
(a) a first current source group including a plurality of current sources comprising:
(i) at least one p-MOS transistor, which can be switched to a first current collecting line in dependence on the digital input value,
(ii) a thermometer current source switching segment including a thermometer current sources, and
(ii) a binary current source switching segment including binary current sources;
(b) a second current source group including a plurality of current sources comprising:
(i) at least one n-MOS transistor, which can be switched to a second current collecting line in dependence on the digital input value,
(ii) a thermometer current source switching segment including a thermometer current sources, and
(iii) a binary current source switching segment including binary current sources;
(c) a current mirror circuit including at least one current mirror transistor for matching the current delivered by the binary current source switching element of the first current source group to the current delivered by the thermometer current source switching segment of the second current source group, and for matching the current delivered by the binary current source switching segment of the second current source group to the current delivered by the thermometer current source switching segment of the first current source group, wherein the mirror current generated by the current mirror transistor corresponds to the sum of all the source currents delivered by the binary current sources of the binary current source switching segment and the source current of the binary current source for the least significant bit LSB of the digital input value; and (d) an output buffer including a differential operational amplifier including inputs in electrical communication with the first and second current collecting lines and an output having an analog output voltage of the current flow differential on the first and second current collecting lines.

* * * * *